United States Patent
Wu et al.

(10) Patent No.: US 9,003,345 B2
(45) Date of Patent: Apr. 7, 2015

(54) SYSTEMS AND METHODS FOR TUNING TECHNOLOGY FILES

(71) Applicant: Taiwan Semiconductor Manufacturing Co., Ltd., Hsin-Chu (TW)

(72) Inventors: Meng-Fan Wu, Keelung (TW); Ke-Ying Su, Taipei (TW); Hsien-Hsin Sean Lee, Duluth, GA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/925,870

(22) Filed: Jun. 25, 2013

(65) Prior Publication Data
US 2014/0282342 A1    Sep. 18, 2014

Related U.S. Application Data

(60) Provisional application No. 61/781,294, filed on Mar. 14, 2013.

(51) Int. Cl.
*G06F 9/455* (2006.01)
*G06F 17/50* (2006.01)

(52) U.S. Cl.
CPC .................................. *G06F 17/5072* (2013.01)

(58) Field of Classification Search
USPC .......................................................... 716/111
See application file for complete search history.

(56) References Cited

U.S. PATENT DOCUMENTS

| 8,522,181 | B2 * | 8/2013 | Nieuwoudt et al. | 716/111 |
| 2009/0199139 | A1 * | 8/2009 | White et al. | 716/4 |
| 2011/0302543 | A1 * | 12/2011 | Izuha | 716/113 |

* cited by examiner

*Primary Examiner* — Eric Lee
(74) *Attorney, Agent, or Firm* — Duane Morris LLP

(57) ABSTRACT

A method generally comprises arranging a plurality of layer combinations into a plurality of groups such that each of the layer combinations is assigned to at least one group. A shifting analysis is performed on a plurality of benchmark circuits for each of the groups. At least one tuning vector value is calculated based, at least in part, on a plurality of criteria vectors of the benchmark circuits. A shift is applied on each of the groups by the tuning vector value and a technology file, such as a 2.5 dimensional RC techfile, is regenerated.

20 Claims, 4 Drawing Sheets

400

| Layer Combination | Capacitance value | |
|---|---|---|
| Gpoly <-> V0, M1 | 1.7e-18 | Group2 |
| Gpoly <-> M0 | 9.6e-19 | Group1 |
| Gpoly <-> OD | 1.4e-16 | |
| Gpoly <-> Gnd | 1.6e-19 | Group3 |

- Group1: Cf only
  - Ngate
  - PGate
- Group2: Cco and Cf
  - M0 + NGate
  - M0 + PGate
  - M0,M1 + NGate
  - M0,M1 + Pgate
- Group3: Gate to ground
  - all

FIG. 3

| Layer Combination | Capacitance value |
|---|---|
| Gpoly <-> V0, M1 | 1.7e-18 |
| Gpoly <-> M0 | 9.6e-19 |
| Gpoly <-> OD | 1.4e-16 |
| Gpoly <-> Gnd | 1.6e-19 |

SYSTEMS AND METHODS FOR TUNING TECHNOLOGY FILES

CROSS-REFERENCE TO RELATED APPLICATIONS

This application claims priority to U.S. Provisional Patent Application Ser. No. 61/781,294 filed on Mar. 14, 2013, the entirety of which is incorporated herein by reference.

FIELD

The disclosed system and method relate to semiconductor integrated circuits ("ICs") and, more particularly, to electronic design automation ("EDA") and simulation tools for tuning technology files, such as RC techfiles.

BACKGROUND

Integrated circuits ("ICs") are incorporated into many electronic devices and the design process for a new IC includes several steps by using, for example, automated electronic design automation ("EDA") tools. The design process can include (1) determining an initial design of the IC; (2) generation of a layout of the design; and (3) verification of the design. During the initial design, a user (of the EDA tool) or designer can identify a set of functions to include in the design, along with their standard delays. The user can also use computer implemented tools to perform functional simulation to ensure that the design performs a pre-simulation. If the design meets circuit performance requirements in the pre-simulation, the user can then initiate floorplan and layout phases to generate an actual layout. For example, the user can generate at least one GDS file that includes the layout of the IC.

Following the layout process, the user can verify the design by using the EDA tools to perform design rule checks ("DRC"), layout versus schematic ("LVS") checks, and RC extraction. In cooperating with RC technology file, the RC extraction tool takes into account the layout of the conductive (e.g., metal) lines of the interconnecting layers generated by the router and computes parasitic resistance and capacitance elements associated with each conductive line. Then a post-simulation verifies circuit performance. The accuracy of post-simulation requires an accurate RC technology file.

In at least some known RC technology file accuracy tuning processes, the user can conduct accuracy tuning of the 2.5 dimensional RC technology file. In at least some known RC techfile tuning methods, the user may tune-up the input profile used for RC technology file generation. For example, the user may change actual parameters, such as the vertical height, width, or dielectric constant of the newly designed IC and/or of the components therein. However, such a method is very time consuming for application programming interface (API) RC techfile generation flow because a three dimensional characterization on every tuned-up profile can take up to approximately one day for each change. Moreover, tuning of a three dimensional profile of, for example, a Fin field effect transistor ("FinFET"), can be complex because of the number of parameters involved. Further, such a method can be difficult to model or take into account silicon effects.

BRIEF DESCRIPTION OF THE FIGURES

FIG. 3 is an exemplary grouping of the three dimensional pattern shown in FIG. 2.

FIG. 4 is an exemplary diagram used to determine at least one parameter shift of each group identified in the grouping shown in FIG. 3.

DETAILED DESCRIPTION

The exemplary system and method described herein speed up the known tuning methods by providing an efficient mathematical approach to characterizing shift parameters of a lookup table of patterns that are characterized by 3D RC extraction tools. More specifically, some embodiments described herein generate at least one 2.5-dimensional RC technology file. During the generation, a plurality of layers for an IC are created and being characterized by 3D RC extraction tool. The three-dimensional patterns include a plurality of layer combinations from the layers for the IC. The layer combinations are arranged into a plurality of groups such that each of the layer combinations is assigned to at least one group. Parameter shift(s) for each of the groups are identified and a shifting analysis is performed for each of the groups based, at least in part, on the identified corresponding parameter shift. A plurality of tuning vector values are calculated for the groups based, at least in part, on the shifting analysis performed for each of the groups, wherein each tuning vector value corresponds to a separate group. Each of the groups is then shifted by the corresponding tuning vector value. Thus, based on the results of the calculations, the lookup table are updated (tuned) and the 2.5D RC technology file now have a more accurate extraction results. By using this modeling technique, an actual input profile change, such as a change to the vertical height, width, or dielectric constant of the IC, is not necessary. Moreover, this modeling technique can even be used to account for silicon effects.

Figure 1:
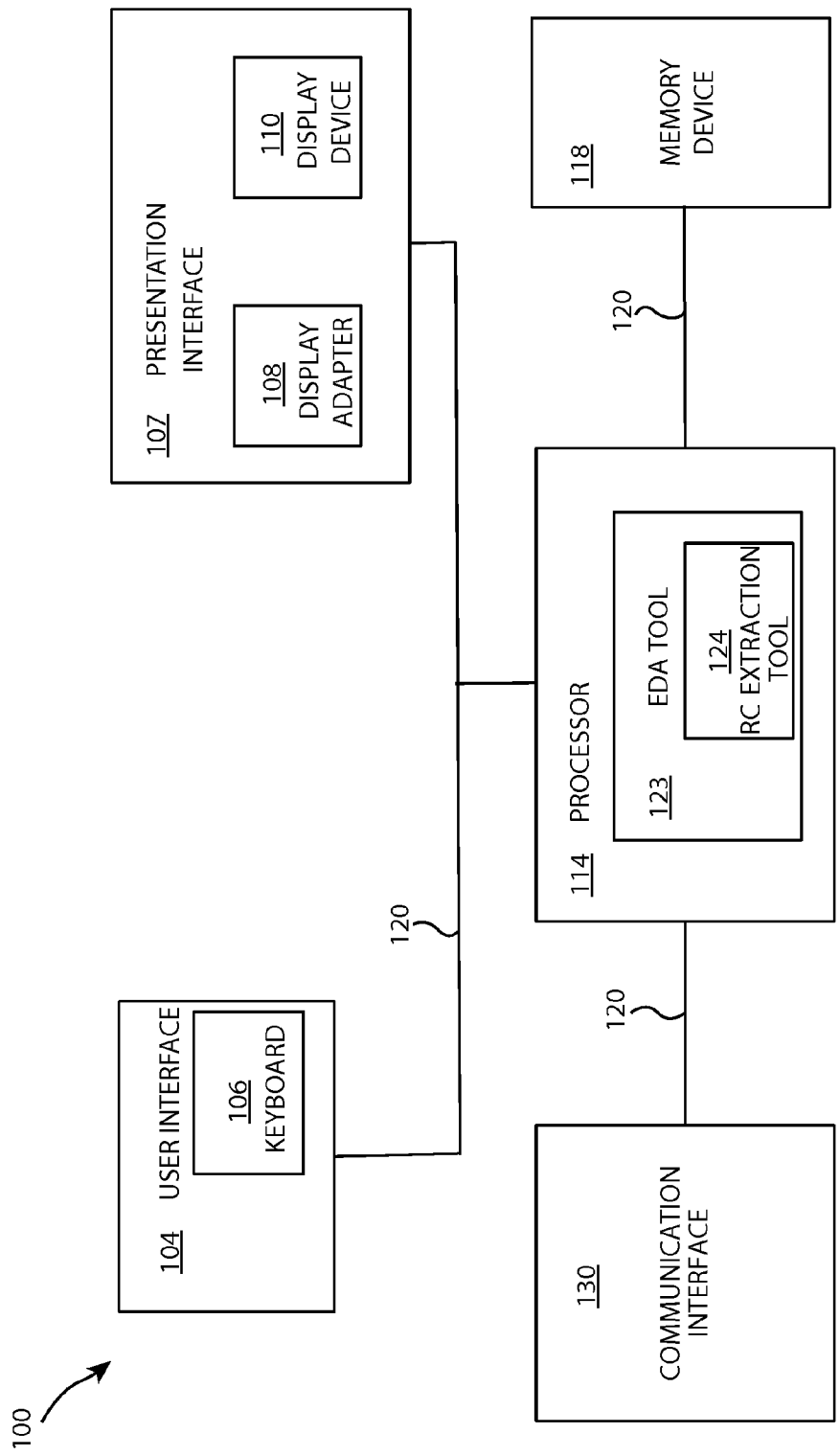
FIG. 1 is a block diagram of an exemplary system used to design and conduct a tuning of a design of a semiconductor integrated circuit ("IC").

FIG. 1 illustrates an exemplary system 100 that can be used to design and conduct a tuning of a design of an IC. System 100 can be a physical computer system or host that includes a user interface 104 that receives at least one input from a user, such as a designer of the IC. In the exemplary embodiment, user interface 104 includes a keyboard 106 that enables the user to input pertinent information. Alternatively, user interface 104 can include, for example, a pointing device, a mouse, a stylus, a touch sensitive panel (e.g., a touch pad or a touch screen), a gyroscope, an accelerometer, a position detector, and/or an audio input interface (e.g., including a microphone).

Moreover, in the exemplary embodiment, system 100 includes a presentation interface 107 that presents information, such as input events and/or validation results, to the user. In the exemplary embodiment, presentation interface 107 includes a display adapter 108 that is coupled to at least one display device 110. Display device 110 can be a visual display device, such as a cathode ray tube ("CRT"), a liquid crystal display ("LCD"), an organic LED ("OLED") display, and/or an "electronic ink" display. Alternatively, presentation interface 107 can include an audio output device (e.g., an audio adapter and/or a speaker) and/or a printer.

System 100 also includes a central processor 114 and at least one non-transitory, computer readable storage medium, such as a memory device 118. In the exemplary embodiment, processor 114 is coupled to user interface 104, presentation interface 107, and to memory device 118 via a system bus 120. In the exemplary embodiment, processor 114 communicates with the user, such as by prompting the user via presentation interface 107 and/or by receiving user inputs via user interface 104.

In the exemplary embodiment, processor 114 is programmed by encoding an operation using one or more executable instructions and providing the executable instructions in memory device 118. The term "processor" refers generally to any programmable system including systems and microcontrollers, reduced instruction set circuits ("RISC"), application specific integrated circuits ("ASIC"), programmable logic circuits ("PLC"), and any other circuit or processor capable of executing the functions described herein. The above examples are exemplary only, and thus are not intended to limit in any way the definition and/or meaning of the term "processor."

In the exemplary embodiment, memory device 118 includes one or more devices that enable information, such as executable instructions and/or other data, to be stored and retrieved. Moreover, in the exemplary embodiment, memory device 118 includes one or more computer readable media, such as, without limitation, dynamic random access memory ("DRAM"), static random access memory ("SRAM"), a solid state disk, and/or a hard disk. In the exemplary embodiment, memory device 118 stores, without limitation, application source code, application object code, configuration data, additional input events, application states, assertion statements, validation results, and/or any other type of data Included within processor 114 is an electronic design automation ("EDA") tool 123 and an RC extraction tool 124 that is included within EDA tool 123. EDA tool 123 and RC extraction tool 124 each comprise one or more software modules that are executed within processor 114. In one embodiment, EDA tool 123 can include software, such as "IC COMPILER"™, sold by Synopsis, Inc. of Mountain View, Calif., which can include a place and route tool (not shown), such as "ZROUTE"™, also sold by Synopsys, Inc. Other EDA tools 123 can be used, such as the "VIRTUOSO" custom design platform (not shown) or the Cadence "ENCOUNTER"® digital IC design platform (not shown), along with the "VIRTUOSO" chip assembly router (not shown), all sold by Cadence Design Systems, Inc. of San Jose, Calif.

System 100, in the exemplary embodiment, also includes a communication interface 130 that is coupled to processor 114 via system bus 120. Moreover, in the exemplary embodiment, communication interface 130 can be coupled to, for example, a remote terminal (not shown), such as a desktop computer, laptop, mobile device, thin client, or other similar device. As such, the remote terminal can be capable of displaying applications running inside system 100 to an end user using the remote terminal.

Figure 2A:
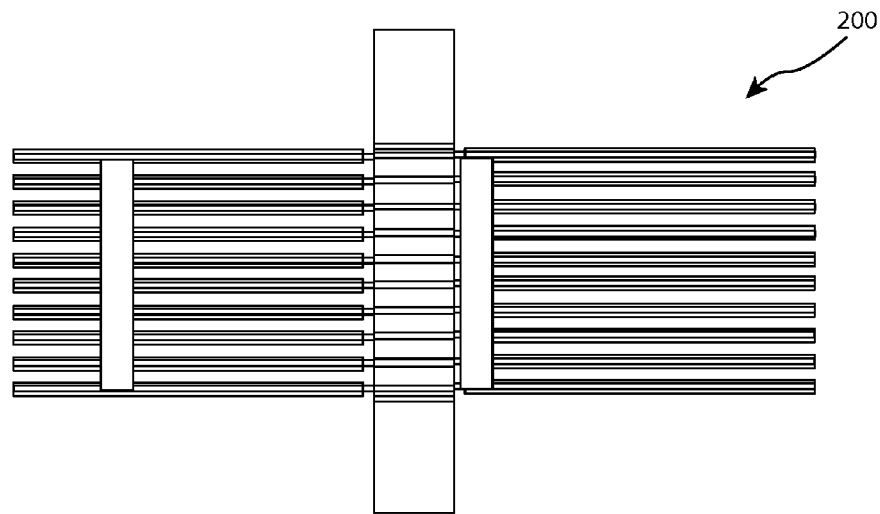
FIG. 2A is a diagram of a plurality of layers for the IC.
Figure 2B:
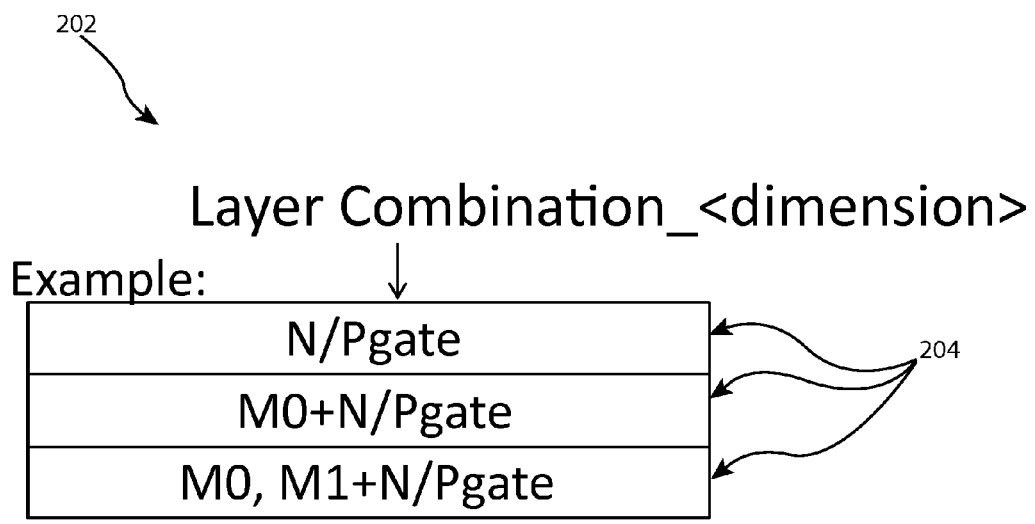
FIG. 2B is an exemplary three dimensional pattern generated by the system shown in FIG. 1.

During operation of system 100, as explained in more detail below with respect to FIG. 5, EDA tool 123 generates a 2.5 dimensional RC technology file that is stored by memory device 118. During the 2.5D RC technology file generation, EDA tool 123 generates a plurality of three-dimensional patterns 202 (shown in FIG. 2B) for 3D model pre-characterization. In the exemplary embodiment, three-dimensional patterns 202 include a plurality of layer combinations 204 (shown in FIG. 2B) of the layers 200. In one embodiment, three-dimensional patterns 202 can be created systematically, such as by a combination of the layers 200 and their physical dimensions. For example, as shown in FIG. 2B, the layer combinations 204 can be 3×2×3, which includes 18 layer combinations. The dimensions considered for patterns 202 can include, for example, combinations of spacing between each of the layers 200 and the width of each of the layers 200.

EDA tool 123 arranges the layer combinations 204 into a plurality of groups 300 (shown in FIG. 3) such that each of the layer combinations 204 is assigned to at least one of the groups 300. In one embodiment, as shown in FIG. 3, three groups (Group 1, Group 2, and Group 3) can be established. Groups 300 can be established based on the types of layers 200 and/or the components disposed on layers 200. For example, Group 1 includes the layers where there is no M0 or M1 patterns formed over a diffusion region (where M1 is the first interconnect conductive line layer, and M0 is a conductive layer at the height of the gate electrode, below the height of the M1 layer). The NGate and the PGate means the device could be an N type or a P type, respectively. Group 2 includes the layers with M0 or M1+M0. Group 3 is for the "gate to ground" components on the layers. Such components can be included on all the three dimensional patterns.

After layer combinations 204 have been arranged into groups 300, EDA tool 123 identifies whether at least one parameter shift occurs for each of the groups 300. For example, EDA tool 123 can identify whether a capacitance shift occurs for each of the groups 200. More specifically, in the exemplary embodiment, EDA tool 123 identifies whether there is a capacitance shift that occurs in Group 1, Group 2, and Group 3. The shifting can be identified by using a known look-up table 400 (shown in FIG. 4) for capacitance values stored in memory device 118. Look-up table 400 can be presented to the user as an output via presentation interface 107. As such, the user is enabled to identify the shifting. While the parameter shift shown in the exemplary embodiment includes a capacitance shift, other parameters can be contemplated and used for the analysis. For example, signal timing shifts for the IC can also be considered.

When the parameter shift(s), such as the capacitance shift(s), have been identified, EDA tool 123 can perform a shifting analysis for each of the groups 300 based, at least in part, on the identified corresponding parameter shift(s). More specifically, as explained in more detail below, the shifting analysis enables the identification of at least one tolerance threshold for at least one benchmark circuit. As explained in more detail below, the results of the shifting analysis, including the identified tolerance threshold(s), facilitates the calculation of a plurality of tuning vector values for each of the groups 300, wherein each tuning vector that is calculated corresponds to a separate group. EDA tool 123 can then shift each of the groups 300 by the corresponding tuning vector value.

This technique facilitates an efficient approach to updating a lookup table (i.e., tuning the lookup table) and the 2.5D RC technology file will now have substantially accurate extraction results. More specifically, by using this approach, the values in lookup table can be changed or shifted based on the identified shifting patterns discussed above. Moreover, an actual input profile change, such as a change to the vertical height, width, or dielectric constant of the IC is no longer necessary. This technique can even be used to account for a silicon effect.

Figure 5:
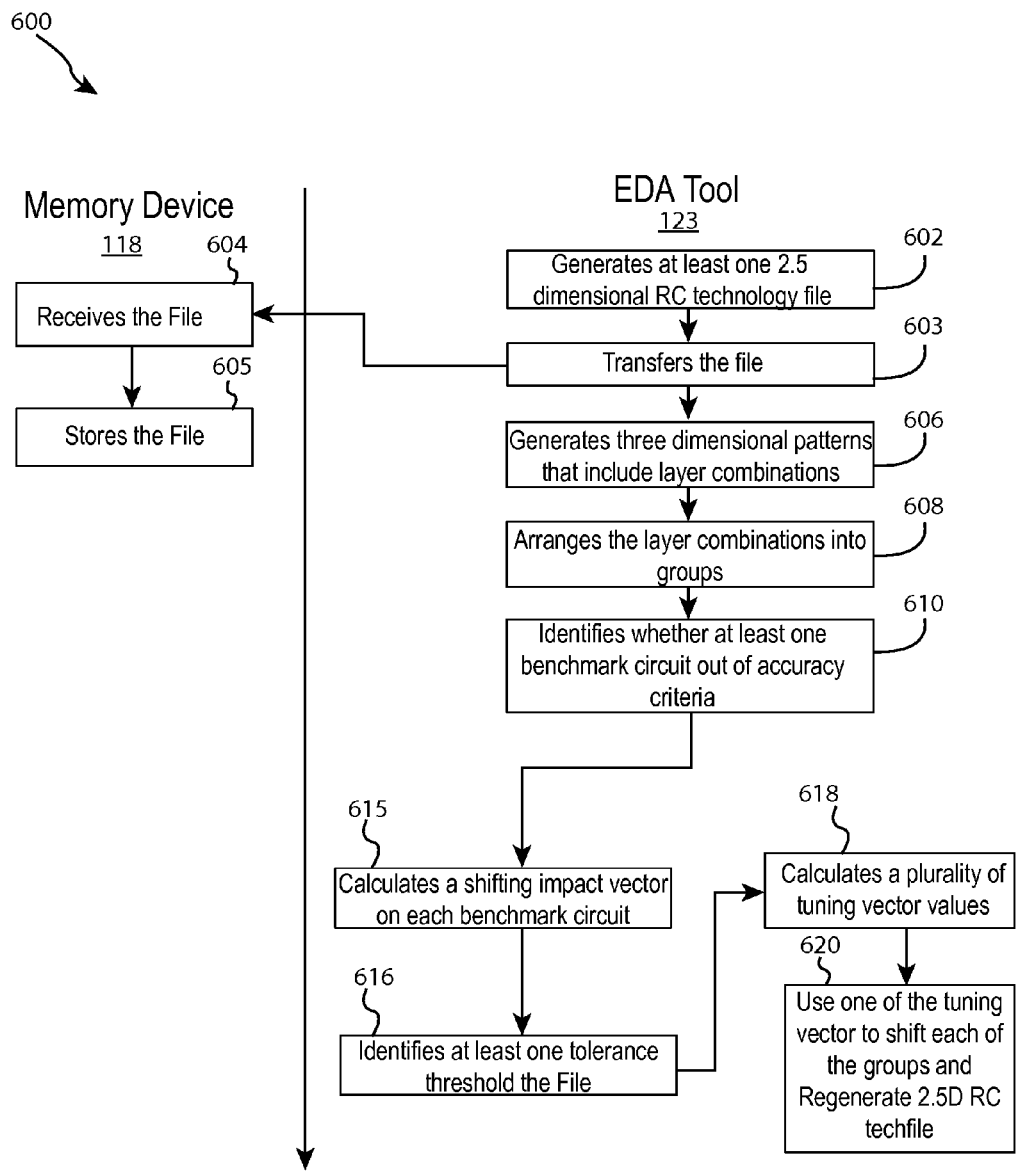
FIG. 5 is a swimlane diagram of an exemplary method for tuning technology files.

FIG. 5 illustrates a swimlane diagram 600 of an exemplary method for tuning a design of an IC (not shown) by using system 100 (shown in FIG. 1). In operation 602, EDA tool 123 generates at least one 2.5 dimensional RC technology file. In operation 603, EDA tool 123 transfers the 2.5 dimensional RC technology file to memory device 118. Memory device 118 receives the 2.5 dimensional RC technology file in operation 604 and stores the file in operation 605.

During the 2.5 dimensional RC technology file generation, EDA tool 123 generates a plurality of three dimensional patterns 202 (shown in FIG. 2B) that include a plurality of layer combinations 204 (shown in FIG. 2B) of layers 200 (shown in FIG. 2A) for an IC in operation 606. Three dimensional patterns 202 can be created systematically, such as by a combination of the layers 200 and their physical dimensions. For example, as shown in FIG. 2B, the layer combinations 204 can be 3×2×3, which includes 18 layer combinations. The dimensions considered for patterns 202 can include, for example, combinations of spacing between each of the layers 200 and the width of each of the layers 200.

In operation 608, EDA tool 123 arranges the layer combinations 204 into a plurality of groups 300 (shown in FIG. 3) such that each of the layer combinations 204 is assigned to at least one of the groups 300. In one embodiment, as shown in FIG. 3, three groups (Group 1, Group 2, and Group 3) can be established. Groups 300 can be established based on the types of layers 200 and/or the components disposed on layers 200. For example, Group 1 includes the layers where there is no M0 or M1 patterns formed over a diffusion region. The NGate and the PGate means the device could be an N type or a P type, respectively. Group 2 includes the layers with M0 or M1+M0. Group 3 is for the "gate to ground" components on the layers. Such components can be included on all the three dimensional patterns.

EDA tool 123, in operation 610, identifies whether at least one benchmark circuit's accuracy is out of criteria. If yes, the proposed RC techfile accuracy tuning technique is applied.

EDA tool 123 calculates a shifting impact value or vector on each benchmark circuit 300 in operation 615, wherein the calculation is based, at least in part, on the identified parameter shift(s). More specifically, in the exemplary embodiment, EDA tool 123 calculates the shifting impact vectors by executing a matrix that incorporates the identified parameter shift(s). An exemplary matrix that can be used to calculate the shifting impact vectors is shown in Table 1 below.

TABLE 1

| Diff % | Group 1 | Group 2 | ... | Group N |
|---|---|---|---|---|
| Ckt 1 | +X$_{11}$ | +X$_{11}$ | | +X$_{1N}$ |
| Ckt 2 | +X$_{21}$ | +X$_{22}$ | | +X$_{2N}$ |
| ⋮ | | | | |
| CktM | +X$_{M1}$ | +X$_{M2}$ | | +X$_{MN}$ |

In the exemplary embodiment, EDA tool 123 inputs the pertinent data obtained into the above-referenced matrix shown in Table 1. More specifically, as shown in Table 2 below, the data incorporated into the above-referenced matrix would include the identified capacitance shift values. In Table 2, Ckt 1 and Ckt 2 are each benchmark circuits.

TABLE 2

| Diff % | Group 1 | Group 2 | Group 3 |
|---|---|---|---|
| Ckt 1 | +0.3% | +0.2% | +0% |
| Ckt 2 | +0.4% | +0.1% | +0.2% |

While continuing to perform the shifting analysis, EDA tool 123 uses the shifting impact values to identify at least one tolerance threshold value or vector for each of the two benchmark circuits, Ckt 1 and Ckt 2, in operation 616. For example, in the exemplary embodiment, upper and lower tolerance or criteria threshold vectors are identified for each of the benchmark circuits, Ckt 1 and Ckt 2. The lower criteria threshold vector can be calculated by using Equation 1 below.

$$(CKt1, CKt2, \ldots, CKtM)^T > (Lctra_1, Lctra_2, \ldots, Lctra_m)^T \quad \text{Eq. 1}$$

The upper criteria threshold value can be calculated by Using Equation 2 below.

$$(CKt1, CKt2, \ldots, CKtM)^T > (Uctra_1, Uctra_2, \ldots, Uctra_m)^T \quad \text{Eq. 2}$$

In the exemplary embodiment, based on the identified parameter shift(s), +3% is used for Ckt 1 and −2% is used for Ckt 2. The silicon target values of +/−1% is used for Ckt 1 and +/−1% for Ckt 2. The results obtained are shown in Table 3 below.

TABLE 3

| Criteria Vector | Lower | Upper |
|---|---|---|
| CKt 1 | −4% | −2% |
| Ckt 2 | +1% | +3% |

After the shifting analysis has been completed, EDA tool 123, in operation 618, calculates a plurality of tuning vector values, $\alpha_N$, for each of the groups 300 based, at least in part, on the results of the shifting analysis performed for each of the groups 300 such that each tuning vector value, $\alpha_N$, correspond to a separate group. For example, in the exemplary embodiment, tuning vector value $\alpha_1$ will correspond to Group 1, tuning vector value $\alpha_2$ will correspond to Group 2, and tuning vector value $\alpha_3$ will correspond to Group 3. In one embodiment, EDA tool 123 can calculate the tuning vectors values by executing a matrix that uses each of the criteria threshold vectors identified above. An exemplary matrix using the upper criteria threshold vectors is shown in Equation 3 below.

$$\begin{pmatrix} x_{11} & x_{12} & \ldots & x_{1N} \\ x_{21} & x_{22} & \ldots & x_{2N} \\ \vdots & & & \vdots \\ x_{M1} & x_{M2} & \ldots & x_{MN} \end{pmatrix} \cdot \begin{pmatrix} \alpha_1 \\ \alpha_2 \\ \vdots \\ \alpha_N \end{pmatrix} \leq \begin{pmatrix} Uctra_1 \\ Uctra_2 \\ \vdots \\ Uctra_M \end{pmatrix} \quad \text{Eq. 3}$$

An exemplary matrix using the lower criteria threshold vectors is shown in Equation 4 below.

$$\begin{pmatrix} x_{11} & x_{12} & \ldots & x_{1N} \\ x_{21} & x_{22} & \ldots & x_{2N} \\ \vdots & & & \vdots \\ x_{M1} & x_{M2} & \ldots & x_{MN} \end{pmatrix} \cdot \begin{pmatrix} \alpha_1 \\ \alpha_2 \\ \vdots \\ \alpha_N \end{pmatrix} \geq \begin{pmatrix} Lctra_1 \\ Lctra_2 \\ \vdots \\ Lctra_M \end{pmatrix} \quad \text{Eq. 4}$$

In the exemplary embodiment, EDA tool 123 inputs the data obtained from the shifting analysis into Equations 3 and 4, which is shown below in Equations 5 and 6, respectively.

$$\begin{pmatrix} 0.3 & 0.2 & 0 \\ 0.4 & 0.1 & 0.2 \end{pmatrix} \cdot \begin{pmatrix} \alpha_1 \\ \alpha_2 \\ \alpha_3 \end{pmatrix} \leq \begin{pmatrix} -2 \\ 3 \end{pmatrix} \quad \text{Eq. 5}$$

$$\begin{pmatrix} 0.3 & 0.2 & 0 \\ 0.4 & 0.1 & 0.2 \end{pmatrix} \cdot \begin{pmatrix} \alpha_1 \\ \alpha_2 \\ \alpha_3 \end{pmatrix} \geq \begin{pmatrix} -4 \\ 1 \end{pmatrix} \quad \text{Eq. 6}$$

When the tuning vectors values, $\alpha_1$, $\alpha_2$, and $\alpha_3$, have each been calculated, then in operation 620, EDA tool 123 will use one of the tuning vectors to shift each of the groups 300 (i.e., Group 1, Group 2, and Group 3) by the corresponding tuning vector value, $\alpha_N$, and regenerate a 2.5D RC techfile. While the exemplary embodiment shows EDA tool 123 performing the shifting of each of the groups 300, the shifting can also be done manually. For example, after EDA tool 123 calculates the tuning vector values, $\alpha_1$, $\alpha_2$, and $\alpha_3$, system 100 can present the values as a textual output to a user via presentation interface 107. Based on the values, the user can then manually input commands, via user interface 104 (shown in FIG. 1), to perform the necessary shifting.

As compared to known tuning systems and methods, the exemplary embodiments provide an efficient mathematical approach to characterizing shift parameters of a lookup table of patterns that are characterized by 3D RC extraction tools. More specifically, some embodiments described herein generate at least one 2.5-dimensional RC technology file. During the generation, a plurality of layers for an IC are created and being characterized by 3D RC extraction tool. The three-dimensional patterns include a plurality of layer combinations from the layers for the IC. The layer combinations are arranged into a plurality of groups such that each of the layer combinations is assigned to at least one group. Parameter shift(s) for each of the groups are identified and a shifting analysis is performed for each of the groups based, at least in part, on the identified corresponding parameter shift. A plurality of tuning vector values are calculated for the groups based, at least in part, on the shifting analysis performed for each of the groups, wherein each tuning vector value corresponds to a separate group. Each of the groups is then shifted by the corresponding tuning vector value. Thus, based on the results of the calculations, the lookup table are updated (tuned) and the 2.5D RC technology file now have a more accurate extraction results. By using this modeling technique, an actual input profile change, such as a change to the vertical height, width, or dielectric constant of the IC, is not necessary. Moreover, this modeling technique can even be used to account for silicon effects.

In some embodiments, a method includes arranging a plurality of layer combinations into a plurality of groups such that each of the layer combinations is assigned to at least one group. A shifting analysis is performed on a plurality of benchmark circuits for each of the groups. At least one tuning vector value is calculated based, at least in part, on a plurality of criteria vectors of the benchmark circuits. A shift is applied on each of the groups by the tuning vector value and a technology file, such as a 2.5 dimensional RC techfile, is regenerated. In some embodiments, a system includes a non-transient machine readable storage medium storing at least one technology file generated by an EDA tool. The system also includes an RC tool within the EDA tool. The EDA tool is configured to arrange a plurality of layer combinations into a plurality of groups such that each of the layer combinations is assigned to at least one group. The EDA tool is also configured to perform a shifting analysis on a plurality of benchmark circuits for each of the groups and to calculate at least one tuning vector value based, at least in part, on a plurality of criteria vectors of the benchmark circuits. Moreover, the EDA tool is configured to apply a shift on each of the groups by the tuning vector value and to regenerate the technology file.

In some embodiments, at least one non-transitory computer-readable storage medium having computer-executable instructions embodied thereon, wherein, when executed by at least one processor, the computer-executable instructions cause the processor to arrange a plurality of layer combinations into a plurality of groups such that each of the layer combinations is assigned to at least one group. The computer-executable instructions also cause the processor to perform a shifting analysis on a plurality of benchmark circuits for each of the groups and to calculate at least one tuning vector value based, at least in part, on a plurality of criteria vectors of the benchmark circuits. Moreover, the computer-executable instructions also cause the processor to apply a shift on each of the groups by the tuning vector value and to regenerate the technology file.

The methods described herein can be at least partially embodied in the form of computer-implemented processes and apparatus for practicing those processes. The disclosed methods can also be at least partially embodied in the form of computer program code embodied in tangible, non-transient machine readable storage media, such as RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods can also be at least partially embodied in the form of computer program code, whether loaded into and/or executed by a computer, such that, when the computer program code is loaded into and executed by a computer, the computer becomes an apparatus for practicing the methods. When implemented on a general-purpose processor, the computer program code segments configure the processor to create specific logic circuits. The methods can alternatively be at least partially embodied in a digital signal processor formed of application specific integrated circuits for performing the methods.

Although the system and method described herein have been described in terms of exemplary embodiments, they are not limited thereto. Rather, the appended claims should be construed broadly, to include other variants and embodiments of the disclosed system and method, which can be made by those skilled in the art without departing from the scope and range of equivalents of the system and method.

What is claimed is:

1. A method for tuning a technology file using a computer system that includes a processor, the method comprising:
    generating a plurality of three dimensional patterns that include a plurality of layer combinations of a plurality of layers for an integrated circuit (IC), using the processor;
    arranging the plurality of layer combinations into a plurality of groups such that each of the plurality of layer combinations is assigned to a separate group, using the processor;
    identifying a plurality of benchmark circuits for each of the plurality of groups, using the processor;
    determining whether the accuracy for at least one of the plurality of benchmark circuits is within a predefined criteria, using the processor;
    calculating a shifting impact vector value for each of the plurality of benchmark circuits when the accuracy for at least one of the plurality of benchmark circuits is not within the predefined criteria, using the processor;
    identifying at least one tolerance threshold vector value for each of the plurality of benchmark circuits, using the processor;
    calculating at least one tuning vector value based, at least in part, on the at least one tolerance threshold vector value, using the processor;
    applying a shift on each of the plurality of groups by the at least one tuning vector value; and
    regenerating a technology file.

2. The method of claim 1, wherein generating a plurality of three dimensional patterns comprises generating the plurality of three dimensional patterns based at least in part on the physical dimensions of the plurality of layers for the IC.

3. The method of claim 1, wherein arranging the plurality of layer combinations comprises arranging the plurality of layer combinations into the plurality of groups based on the type of component disposed on each of the plurality of layer combinations.

4. The method of claim 1, wherein determining whether the accuracy for at least one of the plurality of benchmark circuits is within a predefined criteria comprises identifying whether a plurality of capacitance shifts occur such that each of the plurality of capacitance shifts corresponds to a different group of the plurality of groups by using a look-up table.

5. The method of claim 4, wherein calculating a shifting impact vector value for each of the plurality of benchmark circuits comprises calculating a plurality of capacitance shift values such that each capacitance shift value corresponds to a different identified capacitance shift.

6. The method of claim 5, wherein calculating a shifting impact vector value for each of the plurality of benchmark circuits comprises executing a matrix that incorporates the plurality of capacitance shift values.

7. The method of claim 5, wherein calculating a shifting impact vector value for each of the plurality of benchmark circuits comprises applying the plurality of capacitance shift values to each of the corresponding plurality of groups.

8. The method of claim 1, wherein calculating at least one tuning vector value comprises calculating a plurality of tuning vector values such that each of the plurality of tuning vector values corresponds to a separate group of the plurality of groups.

9. The method of claim 8, wherein applying a shift on each of the plurality of groups comprises applying a shift on each of the plurality of groups by the corresponding tuning vector value.

10. A system comprising:
a non-transient machine readable storage medium storing at least one technology file generated by an electronic design automation ("EDA") tool; and
an RC tool within the EDA tool configured to:
generate a plurality of three dimensional patterns that include a plurality of layer combinations of a plurality of layers for an integrated circuit (IC);
arrange the plurality of layer combinations into a plurality of groups such that each of the plurality of layer combinations is assigned to a separate group;
identify a plurality of benchmark circuits for each of the plurality of groups;
determine whether the accuracy for at least one of the plurality of benchmark circuits is within a predefined criteria;
calculate a shifting impact vector value for each of the plurality of benchmark circuits when the accuracy for at least one of the plurality of benchmark circuits is not within the predefined criteria;
identify at least one tolerance threshold vector value for each of the plurality of benchmark circuits;
calculate at least one tuning vector value based, at least in part, on the at least one tolerance threshold vector value;
apply a shift on each of the plurality of groups by the at least one tuning vector value; and
regenerate the technology file.

11. The system of claim 10, wherein the EDA tool is configured to generate the plurality of three dimensional patterns based at least in part on the physical dimensions of the plurality of layers for the IC.

12. The system of claim 10, wherein the EDA tool is configured to arrange the plurality of layer combinations into the plurality of groups based on the type of component disposed on each of the plurality of layer combinations.

13. The system of claim 10, wherein the EDA tool is configured to determine whether the accuracy for at least one of the plurality of benchmark circuits is within a predefined criteria by identifying whether a plurality of capacitance shifts occur such that each of the plurality of capacitance shifts corresponds to a different group of the plurality of groups by using a look-up table stored in the non-transient machine readable storage medium.

14. The system of claim 13, wherein the EDA tool is configured to calculate the shifting impact vector value by being configured to calculate a plurality of capacitance shift values such that each capacitance shift value corresponds to a different identified capacitance shift.

15. The system of claim 14, wherein the EDA tool is configured to calculate the shifting impact vector value by being configured to execute a matrix that incorporates the plurality of capacitance shift values.

16. The system of claim 14, wherein the EDA tool is configured to calculate the shifting impact vector value by being configured to apply the plurality of capacitance shift values to each of the corresponding plurality of groups.

17. At least one non-transitory computer-readable storage medium having computer-executable instructions embodied thereon, wherein, when executed by at least one processor, the computer-executable instructions cause the at least one processor to:
generate a plurality of three dimensional patterns that include a plurality of layer combinations of a plurality of layers for an integrated circuit (IC);
arrange the plurality of layer combinations into a plurality of groups such that each of the plurality of layer combinations is assigned to a separate group;
identify a plurality of benchmark circuits for each of the plurality of groups;
determine whether the accuracy for at least one of the plurality of benchmark circuits is within a predefined criteria;
calculate a shifting impact vector value for each of the plurality of benchmark circuits when the accuracy for at least one of the plurality of benchmark circuits is not within the predefined criteria;
identify at least one tolerance threshold vector value for each of the plurality of benchmark circuits;
calculate at least one tuning vector value based, at least in part, on the at least one tolerance threshold vector value;
apply a shift on each of the plurality of groups by the at least one tuning vector value; and
regenerate a technology file.

18. The at least one non-transitory computer-readable storage medium of claim 17, wherein the computer-executable instructions cause the at least one processor to determine whether the accuracy for at least one of the plurality of benchmark circuits is within a predefined criteria by identifying whether a plurality of capacitance shifts occur such that each of the plurality of capacitance shifts corresponds to a different group of the plurality of groups by using a look-up table stored in the non-transient machine readable storage medium.

19. The at least one non-transitory computer-readable storage medium of claim 18, wherein the computer-executable instructions cause the at least one processor to calculate the shifting impact vector value by being configured to calculate a plurality of capacitance shift values such that each capacitance shift value corresponds to a different identified capacitance shift.

20. The at least one non-transitory computer-readable storage medium of claim 19, wherein the computer-executable instructions cause the at least one processor to calculate the shifting impact vector by being configured to execute a matrix that incorporates the plurality of capacitance shift values.

\* \* \* \* \*